United States Patent [19]

Cameron et al.

[11] Patent Number: 5,058,124
[45] Date of Patent: Oct. 15, 1991

[54] SEMICONDUCTOR DEVICE AND PIEZOELECTRIC STACK OPTICAL MOUNTING ASSEMBLY

[75] Inventors: Keith H. Cameron; Richard Wyatt, both of Felixstowe; John Mellis, Colchester; Salah A. Al-Chalabi; Michael C. Brain, both of Ipswich, all of England

[73] Assignee: British Telecommunications public limited company, England

[21] Appl. No.: 424,284

[22] PCT Filed: Mar. 29, 1989

[86] PCT No.: PCT/GB89/00324

§ 371 Date: Oct. 23, 1989

§ 102(e) Date: Oct. 23, 1989

[87] PCT Pub. No.: WO89/09503

PCT Pub. Date: Oct. 5, 1989

[30] Foreign Application Priority Data

Mar. 29, 1988 [GB] United Kingdom ................ 8807385

[51] Int. Cl.$^5$ .............................................. H01S 3/101
[52] U.S. Cl. ..................................... 372/107; 372/20; 372/33; 372/34; 372/99; 372/101; 372/102; 357/74; 359/224
[58] Field of Search ...................... 372/34, 28, 36, 97, 372/99, 102, 103, 107, 20, 26, 29, 31-33; 356/363, 351, 349; 350/96.2, 96.15, 6.6, 253, 321, 484, 486, 487, 611, 632, 633; 357/79, 74, 80, 30

[56] References Cited

U.S. PATENT DOCUMENTS

| | | | |
|---|---|---|---|
| 4,149,118 | 4/1979 | Winterling et al. | 318/640 |
| 4,775,211 | 10/1988 | Wondrazek et al. | 350/96.20 |
| 4,830,486 | 5/1989 | Goodwin | 356/5 |
| 4,907,237 | 3/1990 | Dahmani et al. | 372/32 |
| 4,918,702 | 4/1990 | Kimura | 372/34 |
| 4,919,532 | 4/1990 | Mocker et al. | 356/28.5 |

FOREIGN PATENT DOCUMENTS

A 0204572 12/1986 European Pat. Off. .
61-145876 (A) 11/1986 Japan .
WO A
83/02855 8/1983 PCT Int'l Appl. .

OTHER PUBLICATIONS

*Electronics Letters*, vol. 21, No. 3, Jan. 31, 1985, M. R. Matthews et al, "Packaged Frequency-Stable Tunable 20 kHz Linewidth 1.5, etc.", pp. 113–115.

*Electronics Letters*, vol. 22, No. 15, Jul. 17, 1986, F. Faure et al, "External-Cavity Semiconductor Laser with 15 nm, etc.", pp. 795–796.

*IEEE Journal of Quantum Electronics*, vol. QE-14, No. 7, Jul. 1978, IEEE, A. Van Lerberghe et al, "High Stability CW Waveguide, etc.", pp. 481–486.

*Journal of Applied Physics*, vol. 57, No. 5, Mar. 1, 1985, J. E. Epler et al, "Supermodes of Multiple-Stripe Quantum-Well, etc.", pp. 1489–1494.

*Primary Examiner*—William L. Sikes
*Assistant Examiner*—Galen J. Hansen
*Attorney, Agent, or Firm*—Nixon & Vanderhye

[57] ABSTRACT

An external cavity laser assembly in which the laser chip is within a hermetically sealed package and the external cavity is outside the hermetic package. A collimating lens in a screw threaded mounting is disposed outside the hermetic package, the screw thread permitting focussing. The cavity is turned by rotation and translation of a grating, the position of which is electrically controlled via piezoelectric stacks. Thermal expansion of the stacks is compensated by mounting the grating on a rod of suitable material (e.g., ceramic) which also serves to reduce the cavity length while allowing maximum piezoextension. In a second embodiment the assembly is a tunable laser amplifier, with a grating being driven in a similar manner to provide the tuning.

15 Claims, 2 Drawing Sheets

SEMICONDUCTOR DEVICE AND PIEZOELECTRIC STACK OPTICAL MOUNTING ASSEMBLY

This invention relates to semiconductor device assemblies, and in particular to external cavity semiconductor laser packages and laser amplifier packages suitable for incorporation into an optical communications system, and to apparatus for electrically controlling movable optical processing elements within a device package.

Coherent optical communications systems potentially offer greater sensitivity, but for detection in such systems it is necessary to have a continuously tunable, narrow line width, single mode source. Such a source is an external cavity laser in which one semiconductor laser facet is anti-reflection coated to reduce internal feedback and a selected wavelength is reflected back into the laser in order to stimulate dominance of that wavelength in the laser output. The reflection is usually from an externally located diffraction grating forming the external cavity. In order to tune to different wavelengths the grating can be rotated to present a different period or the grating can be moved longitudinally to alter the cavity length. When the grating is rotated the passband of reflected wavelengths changes and thus if rotated sufficiently the passband may become centred on a different mode or become centralised between two modes. Changing the cavity length alters the mode positions, and so a mode centred on the grating passband will move over the passband with variation in longitudinal grating position. Thus it is possible by simultaneous rotation and longitudinal movement to shift the wavelength of the grating passband (by rotation) but remain centred on the same mode (by changing the cavity length) and avoid mode hopping. It is necessary to avoid mode changes during detection because the control circuits are tuned to fine adjustment and cannot cope with the comparatively massive changes that occur with mode change.

In laboratory test equipment, adjustments to the grating position have been made manually by micrometer screw adjustment and the components are all movable and realignable. While such an arrangement is satisfactory for investigative purposes, for implementation in actual communications systems it is necessary to have automatic control, a durable package that is permanently aligned and a hermetically sealed environment for the laser. Similar problems arise in packaging receiver elements such as tunable laser amplifiers.

The present invention is directed towards providing practical packaging including elements requiring hermetic sealing, for systems use.

Accordingly a first aspect of the invention provides a device assembly comprising a light emitting element and an optical processing element, the light emitting element being disposed within a hermetically sealed package having a transparent portion for the passage of light to said optical processing element disposed outside the hermetic package, wherein said optical processing element is mounted on apparatus comprising a plurality of piezoelectric stacks arranged such that selective elongation and/or contraction of the piezoelectric stacks provides rotational and translational movement of the optical processing element.

Another aspect of the invention provides apparatus for moving an optical processing element within a device assembly, the apparatus comprising a plurality of piezoelectric stacks arranged such that selective elongation and/or contraction of the piezoelectric stacks provides rotational and translational movement of the optical processing element.

In a preferred embodiment the light emitting element is a semiconductor laser and the optical processing element is a grating defining an external cavity. Another embodiment comprises a laser amplifier with a tunable filter: the filter may be of reflection or transmission type.

The invention is now described by way of example with reference to the accompanying drawings in which.

Figure 1:
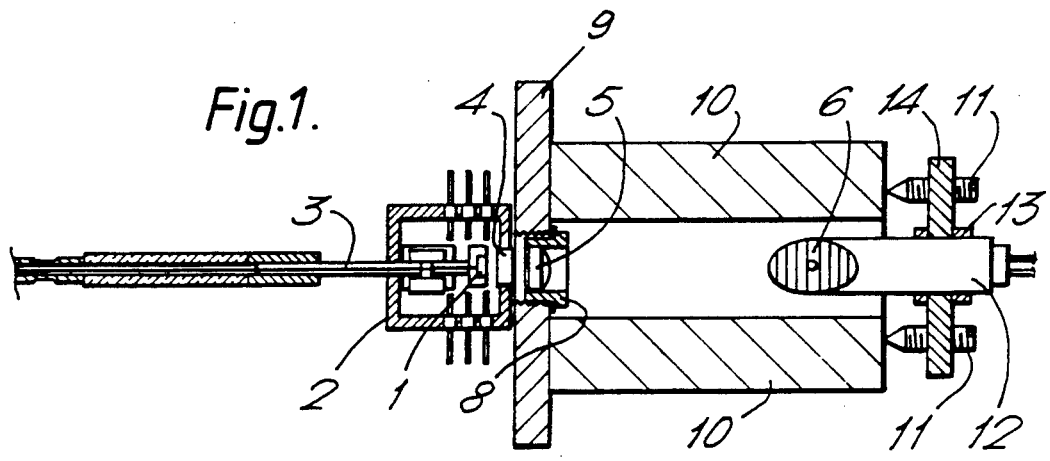
FIG. 1 is a plan view of a first embodiment of the invention.

Referring to FIG. 1, the assembly comprises a laser chip 1 that is hermetically sealed in a chip package 2. One output facet of the laser is coupled to a fiber 3 within the hermetic package 2, the fiber passing out of the package through a fiber package hermetic seal of known type.

The second output facet of the laser is anti-reflection coated and directed towards a window 4 in the hermetic package wall after which the light passes through a lens 5 and on to a grating 6. This arrangement departs from the expected arrangement of making the entire assembly including the external cavity within a hermetic package, and it has the advantage of alleviating materials outgassing problems. However to collimate the beam it is necessary to have a lens and the lenses previously used for such purposes, selfoc or spherical lenses, are of very short focal length (usually a few hundred microns) and need to be located close to the laser facet. Instead of utilising the usual type of lens a much longer focal length lens, of the order of 3 mm, is employed and in this way it is possible to locate the lens outside the hermetic package and avoid the alignment constraints that would be imposed in attempting to align and focus a laser, lens and window within a hermetic package or in aligning the laser with a lens mounted in the package wall. The selected arrangement enables the laser to be located well away from the hermetic package wall, thereby easing assembly handling, and the lens, being located after the window, can incorporate window aberration compensation and be independently aligned and focussed with the laser package.

The lens is mounted in a screw threaded holder 8 that screws into an end plate 9; the end plate and holder are preferably made of Kovar to minimise movement due to thermal expansion. In order to adjust the lens focus with respect to the laser the holder 8 is rotated in the screw thread. Once the correct focusing is achieved it is necessary, for optimum long-term stability, to lock the lens in position and this is done by welding the screw threaded holder in the end plate 9. During the lens adjustment phase it is desirable not to have any slack between the threads of the holder 8 and end plate 9, and a tightly fitting thread is achieved by gold plating the threads of the holder. Other substances may be used to provide the tight screw fitting, but gold is preferred as it maintains metal to metal contact between the holder and end plate which is advantageous at the welding stage. If optimum long-term stability is not required, the lens need not be welded in place. Provision may then be made to adjust the lens position from without, thus facilitating device set-up.

Figure 2:
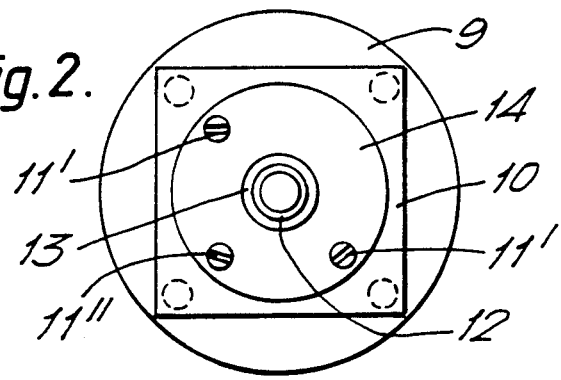
FIG. 2 is an end view of a grating alignment mount of the embodiment of FIG. 1.
Figure 3:
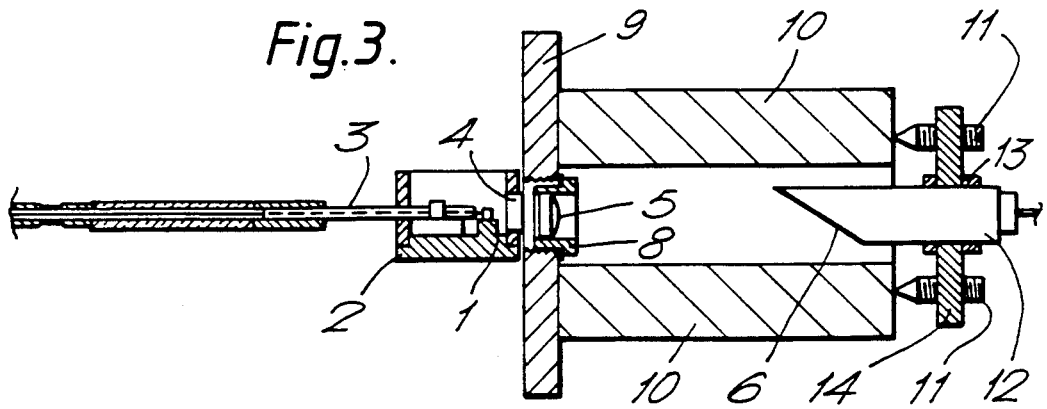
FIG. 3 is a side view of the embodiment of FIG. 1.

Electrical fine control of the grating position is provided by piezoelectric stacks 10, the ends of which engage with mechanical adjustment screws 11. Three piezoelectric stacks are provided as shown by the adjustment screw locations in the end view shown in FIG. 2 although it is possible to utilise a different number of stacks. With the arrangement shown, grating rotation is achieved by elongation or contraction of the stacks aligned with screws 11' while pivoting about the stack aligned with screws 11". Adjustment to cavity length is achieved by simultaneous elongation or contraction of all three stacks 10. The screws 11 provide coarser adjustment for initial setting up. The adjustment ranges are of the order of 3° rotation and 700 microns to 1 mm in cavity length for the screws, and 2 milliradians and 15 microns with the piezoelectric stacks. The range of electrical adjustment with an overall cavity length of 2 centimeters provides tuning of more than 50 GHz.

In order to achieve suitable mode discrimination the cavity length needs to be of the order of 2 cm or less as mentioned above. However in order to get sufficient movement for the tuning range the piezoelectric stacks also need to be of the order of 2 centimeters or more in length, and so it is not possible to mount the grating on the end of the stacks without increasing the cavity length and losing mode discrimination. Therefore the arrangement shown in the drawings was devised, with the grating supported on a rod 12 that projects inwardly between the piezoelectric stacks towards the laser. The rod 12 is provided with a collar 13 to which a flange 14 carrying the adjustment screws 11 is attached. The adjustment screws bear against the ends of the piezoelectric stacks and the grating is moved by virtue of the piezoelectric stack and screw 11 movement being transmitted to the rod 12 via the flange 14. This arrangement, by suitable choice of materials, (for example a ceramic rod 12) also enables compensation for thermal expansion with expansion of the stacks being compensated by expansion in the opposite direction of the ceramic rod.

A further feature of the package is that it is substantially symmetrical about the optical axis, rather than following the normal stacked from base arrangement and this also reduces thermal misalignment problems.

The performance of the above-described external cavity laser can be further improved by the addition of an etalon. The etalon, positioned in the optical path between the lens and the grating, should preferably have a free spectral range (the interval between adjacent transmission peaks) wider than the bandwidth of the grating. Tuning of the etalon is achieved either by rotation or, where it is possible, by physically moving one of the etalon reflectors relative to the other. The etalon may consist of a solid transparent body, glass for example, with a pair of high reflectivity facets. Such an etalon would be tuned by rotation, optimally from/to just off normal incidence with the laser beam. An alternative etalon structure comprises a Fabry-Perot structure in which a pair of high reflectivity mirrors face each other. With such an etalon, tuning may be affected by moving one reflector relative to the other. Preferably such relative movement is achieved by means of a piezo element, such as a ring-shaped piezo element. Such an etalon is also preferably aligned just off normal incidence with the laser beam.

If an etalon is used, it becomes possible to use a grating with a reduced number of lines-per-millimeter, while still achieving the same linewidth. For a given amount of grating rotation, a greater overall tuning range is provided for a lower lines-per-millimeter count of a grating. In the present example, where one might use a 1200 lines-per-millimeter grating without an etalon, one might use a grating with 900, 600 or fewer lines-per-millimeter, giving a tuning range potentially twice as wide as that available with the fine grating.

The price to be paid for the narrower linewidth and/or greater tuning range which result from the use of an etalon is in the increased complexity in the tuning process. Generally with such an arrangement, both the grating and the etalon will have to be moved. Where the etalon is piezo-tunable, as is the case with the above mentioned Fabry-Perot device, it becomes readily possible to tune the etalon and move the grating simultaneously, hence ensuring a narrow linewidth output (determined by the etalon transmission window) while avoiding mode hopping.

Figure 4:
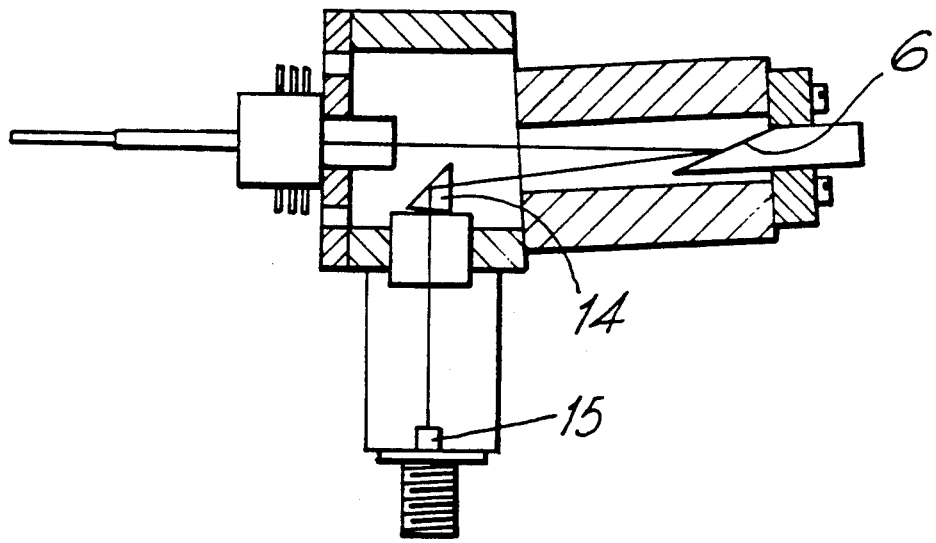
FIG. 4 is a second embodiment of the invention.
Figure 5:
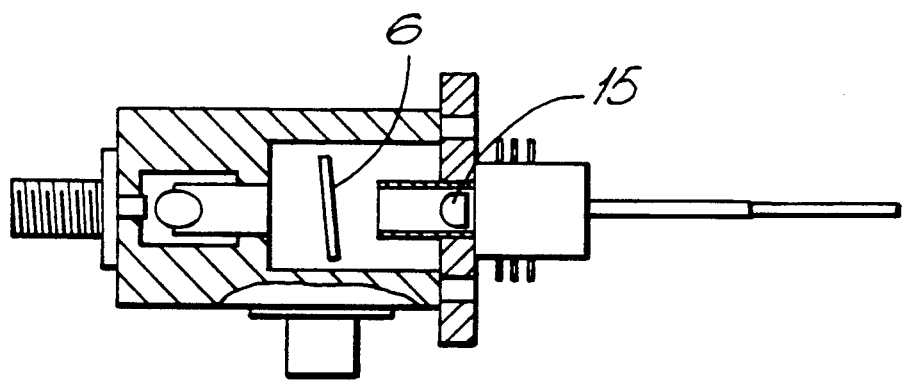
FIG. 5 is a further modification of the invention.

The package described above may be modified for use as a laser amplifier package as shown in FIG. 4. In this instance both facets of the laser are anti-reflection coated and the grating is angled with respect to the optical path so that the reflected light does not re-enter the laser but is directed on to a prism 14 and then a PIN photodiode 15. Alternatively an in-line filter or grating may be used in the position shown in FIG. 5. In this latter instance the filter or grating support is modified to provide a continuous optical path.

The grating or filter may be used between spherical lenses as described in our copending application PCT/GB87/00715; the lens 5 or the lens 5 and window 4 may be replaced by the first spherical lens. When a reflection grating is used the grating is optically interposed between the lenses but not physically so. A laser amplifier package with such a grating or filter may be used to provide tuning for a tunable receiver.

We claim:
1. A device assembly comprising:
 a light emitting element emitting a light,
 an optical processing element, and
 means for mounting the optical processing element in a spaced relationship to the light emitting element so as to intercept said beam,
 the light emitting element being disposed within a hermetically sealed package having a transparent portion for the passage of light to said optical processing element disposed outside the hermetically sealed package,
 wherein said mounting means comprises a plurality of piezoelectric stacks arranged between said light emitting element and said optical processing element such that selective elongation and/or contraction of the piezoelectric stacks provides rotational and translational movement of the optical processing element thereby modifying said spaced relationship.
2. A device assembly according to claim 1 in which the mounting means further comprises an elongated support member extending parallel to the piezoelectric stacks.
3. A device assembly according to claim 2 in which the support member extends partially inwardly between the piezoelectric stacks, the optical processing element being mounted on that portion of the support member which extends between the piezoelectric stacks, whereby the support member enables compensation for thermal expansion in the opposite direction of the support member.

4. A device assembly according to claim 1 further comprising a lens mounted externally of the sealed package in the path of light passing from the light emitting element to the optical processing element via said transparent portion.

5. A device assembly according to claim 4 in which the lens has a focal length of at least 2 mm.

6. A device assembly according to claim 4 in which the lens is mounted in a screw threaded holder.

7. A device assembly according to claim 6 in which the threads of the holder are gold plated.

8. A device assembly according to claim 6 in which the lens holder is welded in position after focussing.

9. An external cavity laser assembly according to claim 4 in which the lens is constructed to compensate for aberrations due to the transparent portion of the package.

10. A device assembly according to claim 1 in which the light emitting element is a semiconductor laser and the optical processing element is a grating defining an external cavity for the laser.

11. A device assembly according to claim 1 in which the light emitting element is a semiconductor laser amplifier and the optical processing element is a tunable filter.

12. A device assembly according to claim 1 in which the assembly external of the hermetic package is substantially symmetrical about the optical axis.

13. A device assembly comprising:
a light emitting element and an optical processing element disposed to intercept light emanating from said light emitting element;
said optical processing element and said light emitting element being spaced apart by plural piezoelectric supports and at least one other support,
said supports providing compensating thermal expansion and contraction movements so that thermally induced change in said spacing in a first direction caused by said piezoelectric supports is compensated by thermally induced change in said spacing in an opposite second direction caused by said other support,
whereby the spacing between said optical processing element and said light emitting element is maintained at a more constant dimension as a function of device assembly temperature.

14. A device assembly comprising:
a semiconductor laser;
a grating defining an external cavity for the laser,
the laser being disposed within a hermetically sealed package having a transparent portion for the passage of light to said grating disposed outside the hermetically sealed package,
said grating being supported and spaced from said transparent portion by a plurality of at least three independently controllable piezoelectric stacks disposed so that selective elongation and/or contraction of the piezoelectric stacks can provide rotational and translational movement of the grating thereby modifying its spaced relationship to the laser.

15. A device assembly comprising:
a semiconductor laser;
a tunable filter;
the laser being disposed within a hermetically sealed package having a transparent portion for the passage of light to said tunable filter disposed outside the hermetically sealed package,
said tunable filter being supported and spaced from said transparent portion by a plurality of at least three independently controllable piezoelectric stacks disposed so that selective elongation and/or contraction of the prezoelectric stacks can provide rotational and translational movement of the filter thereby modifying its spaced relationship to the laser.

* * * * *